United States Patent
Kyoto et al.

(10) Patent No.: US 10,461,506 B2
(45) Date of Patent: Oct. 29, 2019

(54) LASER OSCILLATION APPARATUS

(71) Applicant: Mitsubishi Electric Corporation, Tokyo (JP)

(72) Inventors: Tomohiro Kyoto, Tokyo (JP); Tomotaka Katsura, Tokyo (JP); Daiji Morita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/341,452

(22) PCT Filed: Mar. 17, 2017

(86) PCT No.: PCT/JP2017/011041
§ 371 (c)(1),
(2) Date: Apr. 12, 2019

(87) PCT Pub. No.: WO2018/167975
PCT Pub. Date: Sep. 20, 2018

(65) Prior Publication Data
US 2019/0267777 A1    Aug. 29, 2019

(51) Int. Cl.
*H01S 5/40*  (2006.01)
*H01S 5/14*  (2006.01)
(Continued)

(52) U.S. Cl.
CPC .......... *H01S 5/4012* (2013.01); *G02B 27/283* (2013.01); *H01S 5/141* (2013.01);
(Continued)

(58) Field of Classification Search
CPC ...... H01S 5/4012; H01S 5/141; H01S 5/4025; H01S 5/4087; H01S 5/08004;
(Continued)

(56) References Cited

U.S. PATENT DOCUMENTS

| | | |
|---|---|---|
| 5,404,365 A | 4/1995 | Hiiro |
| 2007/0014008 A1 | 1/2007 | Kennedy |
| 2016/0329685 A1* | 11/2016 | Katsura .............. G02B 6/4214 |

FOREIGN PATENT DOCUMENTS

| | | |
|---|---|---|
| EP | 1182481 A2 | 2/2002 |
| JP | 56-083701 A | 7/1981 |

(Continued)

OTHER PUBLICATIONS

International Search Report dated May 9, 2017 for PCT/JP2017/011041 filed on Mar. 17, 2017, 8 pages including English translation.

(Continued)

*Primary Examiner* — Armando Rodriguez
(74) *Attorney, Agent, or Firm* — Xsensus, LLP (57) ABSTRACT

A laser oscillation apparatus includes a wave plate and a diffraction grating disposed between a laser beam source and a partial reflection mirror. The wave plate changes polarization directions of laser beams emitted from semiconductor lasers to a second direction perpendicular to a first direction. The diffraction grating is disposed at a position where laser beams polarized in the first direction are superposed into one beam and laser beams whose polarization directions are changed to the second direction are superposed into one beam, superposes laser beams polarized in the first direction to have one optical axis, superposes laser beams polarized in the second direction to have one optical axis, and outputs superposed laser beams toward the partial reflection mirror. The laser oscillation apparatus includes a birefringent element to combine laser beams having mutually different optical axes output from the partial reflection mirror into one laser beams having one optical axis.

7 Claims, 9 Drawing Sheets

(51) Int. Cl.
  *G02B 27/28* (2006.01)
  *H01S 3/08* (2006.01)
  *H01S 3/10* (2006.01)
  *H01S 3/23* (2006.01)

(52) U.S. Cl.
  CPC .......... *H01S 5/4025* (2013.01); *H01S 5/4087* (2013.01); *H01S 3/08004* (2013.01); *H01S 3/08009* (2013.01); *H01S 3/10* (2013.01); *H01S 3/10061* (2013.01); *H01S 3/2383* (2013.01); *H01S 3/2391* (2013.01)

(58) Field of Classification Search
  CPC .... H01S 5/08009; H01S 5/10; H01S 5/10061; H01S 5/2383; H01S 5/2391; G02B 27/283
  See application file for complete search history.

(56) References Cited

FOREIGN PATENT DOCUMENTS

| | | |
|---|---|---|
| JP | 07-074436 A | 3/1995 |
| JP | 2004-022679 A | 1/2004 |
| JP | 2004-334169 A | 11/2004 |
| JP | 2016-054295 A | 4/2016 |
| JP | 2017-011163 A | 1/2017 |
| WO | 02/065191 A1 | 8/2002 |
| WO | 03/005106 A1 | 1/2003 |

OTHER PUBLICATIONS

Notification of Reasons for Refusal for Japanese Patent Application No. 2017-545697, dated Oct. 3, 2017, 6 pages including English Translation.

Decision to Grant a Patent for Japanese Patent Application No. 2017-545697, dated Jan. 16, 2018 ,6 pages including English Translation.

\* cited by examiner

LASER OSCILLATION APPARATUS

CROSS-REFERENCE TO RELATED APPLICATIONS

The present application is based on PCT filing PCT/JP2017/011041, filed Mar. 17, 2017, the entire contents of which are incorporated herein by reference.

FIELD

The present invention relates to a laser oscillation apparatus that uses a semiconductor laser.

BACKGROUND

Patent Literature 1 discloses an apparatus that resonates light from a plurality of semiconductor lasers with an external resonator and combines the beams into one beam. In the invention disclosed in Patent Literature 1, a polarizing beam splitter and a retardation plate are provided for each set of a plurality of semiconductor lasers and one emission mirror is used to configure an external resonator, and the retardation plate is adjusted so as to combine emission beams into a polarized and coherently combined high energy beam.

CITATION LIST

Patent Literature

Patent Literature 1: Japanese Patent Application Laid-open No. H7-074436

SUMMARY

Technical Problem

In the invention disclosed in Patent Literature 1, when the number of semiconductor lasers is increased to improve the output and brightness of laser beams, the number of polarizing beam splitters and retardation plates are also increased, and the apparatus becomes large and complicated.

The present invention has been made in view of the above problem, and an object thereof is to obtain a laser oscillation apparatus with enhanced output and brightness of laser beams without causing size increase and complication of the apparatus.

Solution to Problem

In order to solve the above problem and achieve the object, an aspect of the present invention is a laser oscillation apparatus including: a laser beam source comprising a plurality of laser units each including two semiconductor lasers disposed in a fast axis direction of the semiconductor lasers to emit laser beams having a same oscillation wavelength and polarized in a first direction, the laser units having oscillation wavelengths different from each other and being disposed in a slow axis direction of the semiconductor lasers; and a partial reflective element to reflect and return part of the laser beams toward the laser beam source and to transmit a remainder. A polarization-direction changing element and a wavelength dispersive element are disposed between the laser beam source and the partial reflective element. The polarization-direction changing element changes a polarization direction of a laser beam emitted from one of the two semiconductor lasers of the laser unit to a second direction orthogonal to the first direction. The wavelength dispersive element is disposed at a position where the laser beams polarized in the first direction are superposed into one beam and the laser beams whose polarization directions are changed to the second direction are superposed into one beam, superposes the laser beams polarized in the first direction so as to have one optical axis, superposes the laser beams polarized in the second direction so as to have one optical axis, and outputs the superposed laser beams toward the partial reflective element. The laser oscillation apparatus according to an aspect of the present invention further comprises a polarization combining element to combine two laser beams into a laser beam having one optical axis, the two laser beams having optical axes different from each other and being output from the partial reflective element.

Advantageous Effects of Invention

A laser oscillation apparatus according to the present invention can have enhanced output and brightness of laser beams without causing size increase and complication of the apparatus.

DESCRIPTION OF EMBODIMENTS

Hereinafter, a laser oscillation apparatus according to embodiments of the present invention is described in detail with reference to the drawings. Note that, the invention is not limited by the embodiments.

First Embodiment

Figure 1:
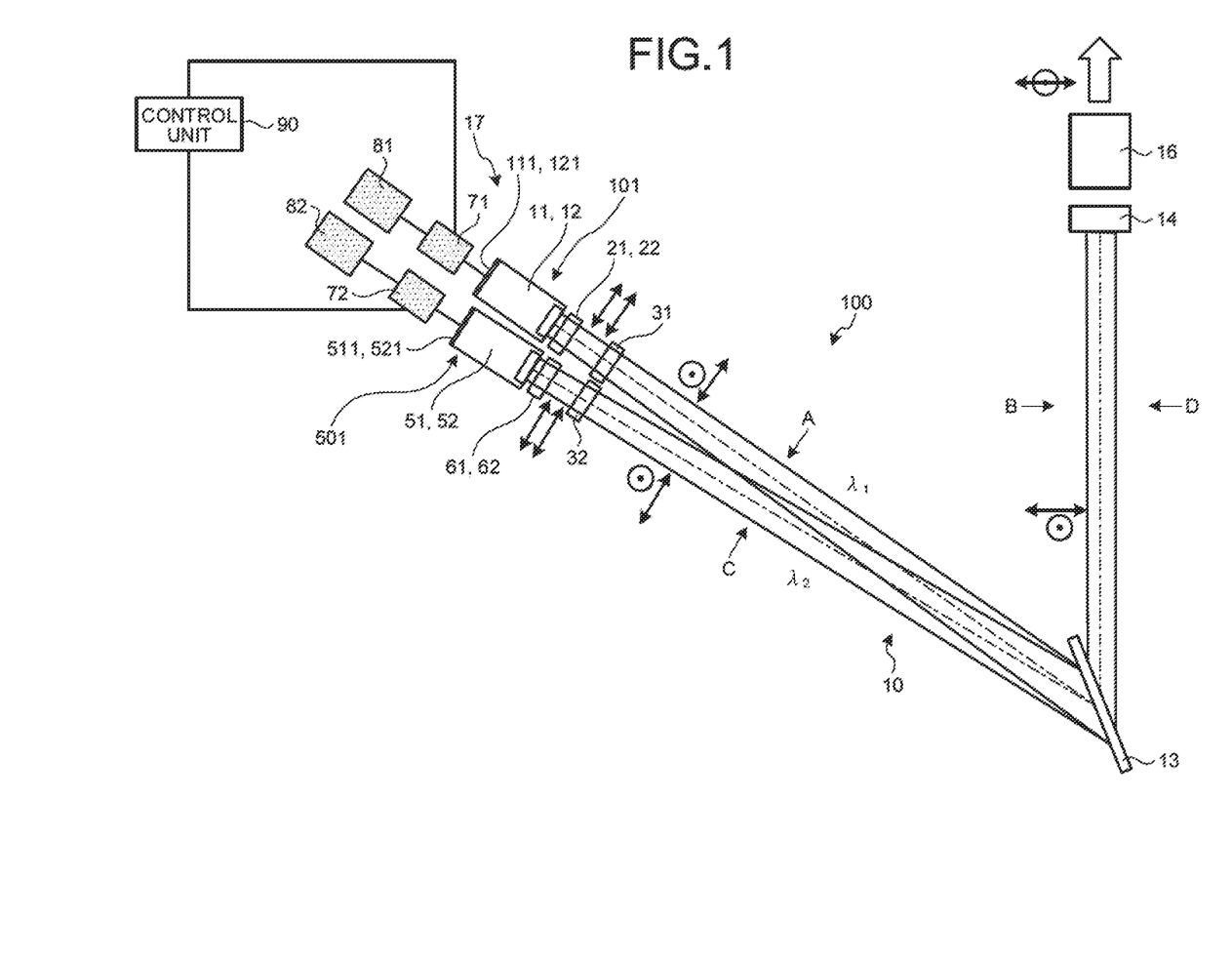
FIG. 1 is a schematic diagram illustrating a configuration of a laser oscillation apparatus according to a first embodiment of the present invention.
Figure 2:
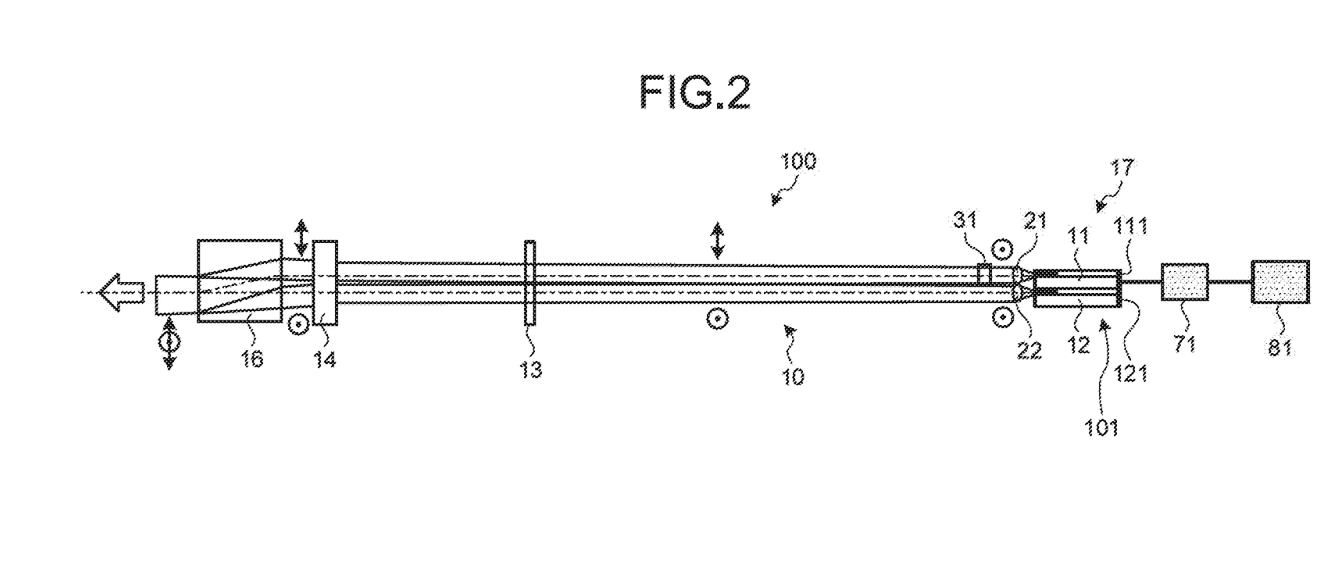
FIG. 2 is a schematic diagram illustrating the configuration of the laser oscillation apparatus according to the first embodiment.
Figure 3:
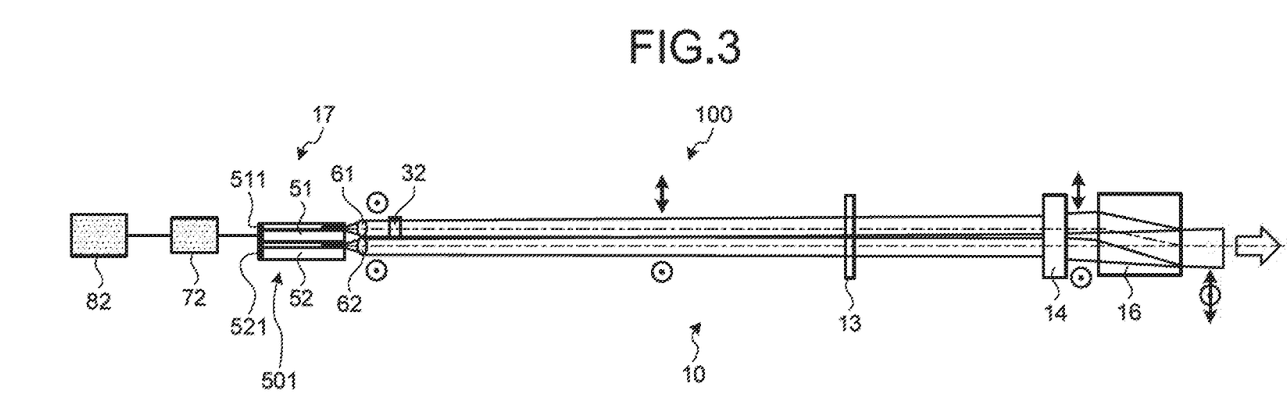
FIG. 3 is a schematic diagram illustrating the configuration of the laser oscillation apparatus according to the first embodiment.

FIGS. 1, 2, and 3 are schematic diagrams illustrating a configuration of a laser oscillation apparatus according to a first embodiment of the present invention. FIG. 1 illustrates a configuration of the optical path of a laser beam in a plane having wavelength dependency between the incident angle and the exit angle of light at a wavelength dispersive element, which will be described later. In the following description, the plane having the wavelength dependency between the incident angle and the exit angle of light at the wavelength dispersive element is referred to as a dispersion combining dimension. In addition, the direction orthogonal to the dispersion combining dimension is referred to as a polarization combining direction. FIGS. 2 and 3 schematically illustrate configurations in the polarization combining direction and in a plane including the optical axis of a laser beam. FIG. 2 illustrates, in combination, a portion that extends from a diffraction grating 13 toward semiconductor lasers 11 and 12 viewed from the direction of the arrow A in FIG. 1 and a portion that extends from the diffraction grating 13 toward a partial reflection mirror 14 viewed from the direction of the arrow B in FIG. 1. FIG. 3 illustrates, in combination, a portion that extends from the diffraction grating 13 toward semiconductor lasers 51 and 52 viewed from the direction of the arrow C in FIG. 1 and a portion that extends from the diffraction grating 13 toward the partial reflection mirror 14 viewed from the direction of the arrow D in FIG. 1.

A laser oscillation apparatus 100 according to the first embodiment includes a control unit 90, drive circuits 71 and 72, driving power supplies 81 and 82, an external resonator 10, the diffraction grating 13, and a birefringent element 16. The external resonator 10 includes a laser beam source 17 and the partial reflection mirror 14 that reflects and returns part of a laser beam toward the laser beam source 17 and transmits the remainder. The partial reflection mirror 14 is disposed between the diffraction grating 13 and the birefringent element 16. The laser beam source 17 includes a laser unit 101 and a laser unit 501. The laser unit 101 includes the semiconductor lasers 11 and 12 that each emit a laser beam polarized in a first direction. The laser unit 501 includes the semiconductor lasers 51 and 52 that each emit a laser beam polarized in the first direction. In the laser unit 101, the semiconductor lasers 11 and 12 are disposed side by side in the fast axis direction of the semiconductor lasers 11 and 12. In the laser unit 501, the semiconductor lasers 51 and 52 are disposed side by side in the fast axis direction of the semiconductor lasers 51 and 52. In the first embodiment, the fast axis direction of the semiconductor lasers 11, 12, 51, and 52 is the same as the first direction. The wavelength of a laser beam emitted from each of the semiconductor lasers 11 and 12 is λ1, and the wavelength of a laser beam emitted from each of the semiconductor lasers 51 and 52 is λ2. Thus, the oscillation wavelength of each of the semiconductor lasers 11 and 12 is different from the oscillation wavelength of each of the semiconductor lasers 51 and 52. That is, the wavelength of a laser beam differs in the laser unit 101 and the laser unit 501.

Between the laser beam source 17 and the partial reflection mirror 14, collimator lenses 21, 22, 61 and 62, wave plates 31 and 32, and the diffraction grating 13 are disposed. The collimator lenses 21, 22, 61 and 62 are collimating elements that collimate laser beams emitted from the semiconductor lasers 11, 12, 51, and 52. The wave plates 31 and 32 are polarization-direction changing elements that change the polarization directions of the laser beams emitted from the semiconductor lasers 11 and 51 to a second direction orthogonal to the first direction. The diffraction grating 13 is a wavelength dispersive element that emits light in the direction depending on the wavelength of incident light. The diffraction grating 13 superposes laser beams emitted from the laser units 101 and 501 and polarized in the first direction into one beam, superposes, into one beam, laser beams emitted from the laser units 101 and 501 and having their polarization directions changed to the second direction, and outputs the polarized beams toward the partial reflection mirror 14. The laser units 101 and 501 are disposed in the plane of the dispersion combining dimension. The slow axis direction of the semiconductor lasers 11, 12, 51, and 52 is the same as the second direction. Thus, it can be said that the laser units 101 and 501 are disposed in the slow axis direction of the semiconductor lasers 11, 12, 51, and 52.

Here, a laser beam whose polarization direction is the first direction means that a laser beam has the polarization direction in the plane of the dispersion combining dimension. In addition, a laser beam whose polarization direction is the second direction means a laser beam polarized in the polarization combining direction. However, the first direction and the second direction are defined for convenience of explanation. Thus, a laser beam polarized in the first direction may be a laser beam polarized in the polarization combining direction, and a laser beam polarized in the second direction may be a laser beam polarized in the plane of the dispersion combining dimension. The positions of the semiconductor lasers 11 and 12 of the laser unit 101 are different from each other in the polarization combining direction, and the positions of the semiconductor lasers 51 and 52 of the laser unit 501 are different from each other in the polarization combining direction. The semiconductor lasers 11 and 12 are in contact with each other without any gap therebetween, and the semiconductor lasers 51 and 52 are in contact with each other with each other without any gap therebetween. By disposing the semiconductor lasers 11 and 12 in contact with each other without any gap and the semiconductor lasers 51 and 52 in contact with each other without any gap, it is possible to downsize the laser oscillation apparatus in the polarization combining direction. Laser beams emitted from the semiconductor lasers 11, 12, 51, and 52 are typically dependent on a structure and polarized in one direction.

The birefringent element 16 is a polarization combining element that further superposes, into one beam, the laser beam obtained by superposition by the diffraction grating 13 and polarized in the first direction and the laser beam obtained by superposition by the diffraction grating 13 and polarized in the second direction. That is, the birefringent element 16 combines the two laser beams having mutually different optical axes and output from the diffraction grating 13 to a laser beam having one optical axis. In the following description, superimposing beams having different polarization directions into one beam is referred to as polarization combining. The drive circuits 71 and 72 control turning on and off of the semiconductor lasers 11, 12, 51, and 52 and have a protection function of interrupting the power supply to the semiconductor lasers 11, 12, 51, and 52 when a short-circuit occurs. The driving power supplies 81 and 82 supply power to the drive circuits 71 and 72, respectively. The control unit 90 controls the drive circuits 71 and 72 in accordance with a command input from a numerical control device. The control unit 90 is implemented by a processor.

In the first embodiment, the diffraction grating 13 that diffracts the laser beams with a plurality of grooves is a wavelength dispersive element that emits, at the same exit angle, the laser beams incident from the laser unit 101 and from the laser unit 501 at different incident angles. Thus, in the first embodiment, the dispersion combining dimension is a plane perpendicular to the grooves of the diffraction grating 13, and the polarization combining direction is a direction parallel to the grooves of the diffraction grating 13. The arrows illustrated in FIGS. 1, 2, and 3 indicate polarization parallel to the paper surface. The black and white concentric circles illustrated in FIGS. 1, 2, and 3 indicate polarization perpendicular to the paper surface. In addition, the symbols, in which black and white concentric circles are superimposed on arrows, illustrated in FIGS. 1, 2, and 3 indicate that polarization parallel to the paper surface is overlapped with polarization perpendicular to the paper surface in one laser beam.

As the semiconductor lasers 11, 12, 51, and 52, single-emitter semiconductor lasers each having one laser medium can be used, or semiconductor laser bars in which a plurality of plural laser media are disposed on a straight line can be used. By using semiconductor laser bars, it is possible to obtain high output relatively inexpensively. In the first embodiment, the semiconductor lasers 11 and 12 and the semiconductor lasers 51 and 52 are disposed on one semiconductor laser module in close proximity in the polarization combining direction. As the semiconductor laser module, what is called a semiconductor laser array or a semiconductor laser stack can typically be used.

The collimator lenses 21, 22, 61, and 62 collimate laser beams emitted from the semiconductor lasers 11, 12, 51, and 52 by reducing the divergent angles of the laser beams. Moreover, the collimator lenses 21, 22, 61, and 62 diffuse light by increasing the divergent angle of the light incident toward the semiconductor lasers 11, 12, 51, and 52.

The wave plate 31 rotates the polarization direction of a laser beam emitted from the semiconductor laser 11 by 90 degrees. Since the polarization directions of laser beams emitted from the semiconductor lasers 11 and 12 are the same at the time of being emitted from the semiconductor lasers 11 and 12, the polarization direction of the laser beam emitted from the semiconductor laser 11 is different from the polarization direction of the laser beam emitted from the semiconductor laser 12 by 90 degrees after passing through the wave plate 31. The wave plate 32 rotates the polarization direction of a laser beam emitted from the semiconductor laser 51 by 90 degrees. Since the polarization directions of laser beams emitted from the semiconductor lasers 51 and 52 are the same at the time of being emitted from the semiconductor lasers 51 and 52, the polarization direction of the laser beam emitted from the semiconductor laser 51 is different from the polarization direction of the laser beam emitted from the semiconductor laser 52 by 90 degrees after passing through the wave plate 32.

The diffraction grating 13 is disposed at a position where a plurality of laser beams polarized in the first direction are superposed into one beam and a plurality of laser beams whose polarization directions are changed to the second direction are superposed into one beam. Specifically, the diffraction grating 13 is disposed at a position where the laser beam having the wavelength $\lambda 1$ emitted from the semiconductor laser 12 and polarized in the first direction and the laser beam having the wavelength $\lambda 2$ emitted from the semiconductor laser 52 and polarized in the first direction are superposed into one beam and where the laser beam having the wavelength $\lambda 1$ emitted from the semiconductor laser 11, having passed through the wave plate 31, and polarized in the second direction and the laser beam having the wavelength $\lambda 2$ emitted from the semiconductor laser 51, having passed through the wave plate 32, and polarized in the second direction are superposed into one beam. The diffraction grating 13 superposes a plurality of laser beams polarized in the first direction so as to have one optical axis, superposes a plurality of laser beams polarized in the second direction so as to have one optical axis, and outputs the superposed beams toward the partial reflection mirror 14. Specifically, the diffraction grating 13 superposes a laser beam having the wavelength $\lambda 1$ incident from the semiconductor laser 11 via the wave plate 31 and polarized in the second direction and a laser beam having the wavelength $\lambda 2$ incident from the semiconductor laser 51 via the wave plate 32 and polarized in the second direction into one beam. In addition, the diffraction grating 13 superposes a laser beam having the wavelength $\lambda 1$ incident from the semiconductor laser 12 and polarized in the first direction and a laser beam having the wavelength $\lambda 2$ incident from the semiconductor laser 52 and polarized in the first direction into one beam. As illustrated in FIG. 2, since the diffraction grating 13 does not affect a laser beam in the polarization combining direction, the positional relation between a laser beam from the semiconductor laser 11 and a laser beam from the semiconductor laser 12 in the polarization combining direction does not change before and after passing through the diffraction grating 13. In a similar manner, the positional relation between a laser beam from the semiconductor laser 51 and a laser beam from the semiconductor laser 52 in the polarization combining direction does not change before and after passing through the diffraction grating 13.

The diffraction grating 13 diffracts, among laser beams incident from the partial reflection mirror 14, a laser beam having the wavelength component of the wavelength $\lambda 1$ toward the semiconductor lasers 11 and 12 and a laser beam having the wavelength component of the wavelength $\lambda 2$ toward the semiconductor lasers 51 and 52.

Some wavelength dispersive elements, such as the diffraction grating 13, show polarization dependency in which the ratio of the emission light to the incident light varies depending on the polarization direction. The diffraction grating 13 used in the laser oscillation apparatus 100 according to the first embodiment has less polarization dependency of the ratio of the emission light to the incident light.

The partial reflection mirror 14 is disposed in a direction in which the laser beams having the wavelength $\lambda 1$ emitted from the semiconductor lasers 11 and 12 and the laser beams having the wavelength $\lambda 2$ emitted from the semiconductor lasers 51 and 52 are emitted from the diffraction grating 13. The partial reflection mirror 14 reflects part of the laser beams incident from the diffraction grating 13 so as to be incident on the diffraction grating 13 and transmits the remainder.

As illustrated in FIGS. 2 and 3, the laser beams transmitted through the partial reflection mirror 14 are two beams with different polarizations in the polarization combining direction. Note that, the laser beams emitted from the partial reflection mirror 14 appear to be one superposed laser beam in the dispersion combining dimension. Each laser beam is a laser beam wavelength-combined by the diffraction grating 13 and has laser beams with different wavelengths of $\lambda 1$ and $\lambda 2$. The birefringent element 16 bends the optical path of one of the two laser beams transmitted through the partial reflection mirror 14 and having different polarization directions and converts the two laser beams having different polarization directions into one laser beam having polarization components in two directions.

Quartz ($SiO_2$), yttrium vanadate ($YVO_4$), calcite ($CaCO_3$), or rutile ($TiO_2$) can be used for the birefringent element 16, but the birefringent element 16 is not limited thereto. In such a crystal, a phenomenon called walk-off occurs, in which the direction of the pointing vector of a polarized beam in a certain direction varies from the direction of the wavevector. When a ray of light whose crystal axis and polarization direction are perpendicular to each other is defined as the ordinary ray, and a ray of light whose crystal axis and polarization direction are parallel to each other is defined as the extraordinary ray, walk-off occurs in the extraordinary ray. In the ordinary ray, the direction of the pointing vector coincides with the direction of the wavevector. Crystals with little impurities are easy to obtain from quartz and yttrium vanadate. Thus, when the intensity of a beam is high, it is preferable to use quartz or yttrium vanadate crystals for the birefringent element 16.

The walk-off angle ρ is expressed by following Formula (1), where $n_e$ is the refractive index of the ordinary ray, $n_o$ is the refractive index of the extraordinary ray, and θ is the angle formed between the incident optical axis and the optical axis of the crystal.

[Formula 1]

$$\rho = \pm \tan^{-1}[(n_o/n_e)^2 \tan \theta] \mp \theta \qquad (1)$$

When the interval between two beams incident on the birefringent crystal is δ, the length of the birefringent crystal is L, and L expressed by following Formula (2) is selected, then two beams having different polarization directions by 90 degrees can be combined by the birefringent element 16.

$$\delta = 1 \tan \rho \qquad (2)$$

Since the difference between the refractive index of the ordinary ray and the refractive index of the extraordinary ray is large in an yttrium vanadate crystal, the length L of the birefringent crystal necessary for combining the ordinary ray and the extraordinary is short, and thus the external resonator 10 can be easily downsized.

The operation of the laser oscillation apparatus 100 according to the first embodiment is described. When the drive circuits 71 and 72 cause the driving power supplies 81 and 82 to apply voltages to the semiconductor lasers 11, 12, 51, and 52 in accordance with a command from the control unit 90, laser beams are emitted from the semiconductor lasers 11, 12, 51, and 52. The laser beams emitted from the semiconductor lasers 11, 12, 51, and 52 pass through the collimator lenses 21, 22, 61, and 62 so as to be collimated. The laser beams emitted from the semiconductor lasers 11 and 51 pass through the wave plates 31 and 32 so that the polarization directions thereof are rotated by 90 degrees, and thus they are polarized in the direction perpendicular to the polarization direction of the laser beams emitted from the semiconductor lasers 12 and 52.

The laser beams collimated by the collimator lenses 22 and 62 and the laser beams having passed through the wave plates 31 and 32 are incident on the diffraction grating 13 at different directions depending on the wavelength and are emitted in the same direction because of the wavelength dependency between the incident angle and the exit angle of light at the diffraction grating 13. That is, the laser beam having the wavelength λ1 and the laser beam having the wavelength λ2 are combined.

Part of the laser beams emitted from the diffraction grating 13 is reflected by the partial reflection mirror 14 and returns to the diffraction grating 13, and the remainder passes through the partial reflection mirror 14 and is incident on the birefringent element 16.

The traveling direction of the laser beams reflected by the partial reflection mirror 14 and returned to the diffraction grating 13 is separated into two directions for the laser beam having the wavelength λ1 and the laser beam having the wavelength λ2 because of the wavelength dispersion action of the diffraction grating 13. That is, in the laser beams incident from the partial reflection mirror 14, the component having the wavelength λ1 returns toward the semiconductor lasers 11 and 12 and the component having the wavelength λ2 returns toward the semiconductor lasers 51 and 52.

The laser beam returning from the diffraction grating 13 toward the semiconductor laser 11 passes through the wave plate 31 so that the polarization direction thereof is rotated by 90 degrees again, and thus it is polarized in the same direction as the laser beam immediately after being emitted from the semiconductor laser 11. The laser beam having passed through the wave plate 31 passes through the collimator lens 21 so as to be convergent light, and it is then incident on the semiconductor laser 11. The laser beams returning from the diffraction grating 13 toward the semiconductor laser 12 passes through the collimator lens 22 so as to be convergent light, and it is then incident on the semiconductor laser 12.

The laser beams incident on the semiconductor lasers 11 and 12 are reflected by reflective coatings 111 and 121 and are then emitted from the semiconductor lasers 11 and 12 again.

The laser beam returning from the diffraction grating 13 toward the semiconductor laser 51 passes through the wave plate 32 so that the polarization direction thereof is rotated by 90 degrees again, and thus it is polarized in the same direction as the laser beam immediately after being emitted from the semiconductor laser 51. The laser beam having passed through the wave plate 32 passes through the collimator lens 61 so as to be convergent light, and it is then incident on the semiconductor laser 51. The laser beam returning from the diffraction grating 13 toward the semiconductor laser 52 passes through the collimator lens 62 so as to be convergent light, and it is then incident on the semiconductor laser 52.

The laser beams incident on the semiconductor lasers 51 and 52 are reflected by reflective coatings 511 and 521 and are then emitted from the semiconductor lasers 51 and 52 again.

As described above, the laser beams emitted from the semiconductor lasers 11, 12, 51, and 52 are amplified between the reflective coatings 111, 121, 511, and 521 and the partial reflection mirror 14. That is, two kinds of polarized laser beams orthogonal to each other resonate in the external resonator 10.

In the above description, the birefringent element 16 is used for the polarization combining element, but a polarizing beam splitter can also be used. When a semiconductor laser module having a short distance between beams, such as a semiconductor laser stack, is used for the semiconductor lasers 11, 12, 51, and 52, the distance between beams of the semiconductor lasers 11 and 12 and the distance between beams of the semiconductor lasers 51 and 52 each are 10 mm or less. In order to combine beams from a large number of semiconductor laser elements, the distance between the diffraction grating 13 and the semiconductor lasers 11, 12, 51, and 52 is 100 mm or more. Although beams are collimated by the collimator lenses 21, 22, 61, and 62, the beams are diffused because of the diffraction effect of the diffraction grating 13. Thus, the beams may overlap at the partial reflection mirror 14 corresponding to the exit of the external resonator 10. When the optical axes of the beams do not overlap with each other but the profiles overlap, the polarizing beam splitter cannot polarization-combine the beams. That is, when the interval between the semiconductor lasers 11 and 12 or the interval between the semiconductor lasers 51 and 52 is narrow and the profiles of the beams overlap, the polarizing beam splitter cannot polarization-combine the beams.

However, the birefringent element 16 used for the polarization combining element can polarization-combine the beams with overlapped profiles, and the semiconductor laser module with narrow intervals between the beams can thus be used for the semiconductor lasers 11, 12, 51, and 52. By using a semiconductor laser module with narrow intervals between beams, it is possible to have a common basic part in the vicinity of the semiconductor lasers 11, 12, 51, and 52, and to obtain a cost reduction effect.

In the above description, the diffraction grating 13 is used for the wavelength dispersive element, but the wavelength dispersive element is not limited to a diffraction grating. A prism can also be used for the wavelength dispersive element. In the above description, the wave plates 31 and 32 are used for the polarization-direction changing element that changes the polarization directions of laser beams from the semiconductor lasers 11 and 51, but rotators may be used instead of the wave plates 31 and 32. In the above description, the partial reflection mirror 14 is used for the partial reflective element, but the partial reflective element can also be implemented by a total reflection mirror that is installed such that a laser beam partially hits the total reflection mirror.

As described above, since the laser oscillation apparatus 100 according to the first embodiment polarization-combines laser beams from two semiconductor lasers disposed at different positions in the polarization combining direction, the laser oscillation apparatus 100 can be more downsized than the configuration in which the same number of semiconductor lasers are disposed at the same position in the polarization combining direction. That is, it is possible for the laser oscillation apparatus 100 according to the first embodiment to increase the brightness of laser beams while the increase in size of the apparatus is suppressed.

In the above description, the semiconductor lasers 51 and 52 of the laser unit 501 both emit laser beams polarized in the first direction, but the semiconductor lasers 51 and 52 may be installed such that laser beams emitted therefrom are polarized in the second direction. In the case where the semiconductor lasers 51 and 52 emit laser beams polarized in the second direction, the polarization direction of only one of the laser beams emitted from the semiconductor lasers 51 and 52 is changed to the first polarization direction by using a polarization-direction changing element, such as a wave plate; therefore, it is possible to superpose the laser beams from the semiconductor lasers 11, 12, 51, and 52 by the birefringent element 16 and to increase the brightness of the laser beams.

In the above description, the semiconductor lasers 11 and 12 are disposed such that they are stacked in the polarization combining direction orthogonal to the dispersion combining dimension. However, the semiconductor lasers 11 and 12 are not necessarily stacked in the polarization combining direction and are only required to be located at different positions in the polarization combining direction. The same applies to the semiconductor lasers 51 and 52.

Second Embodiment

Figure 4:
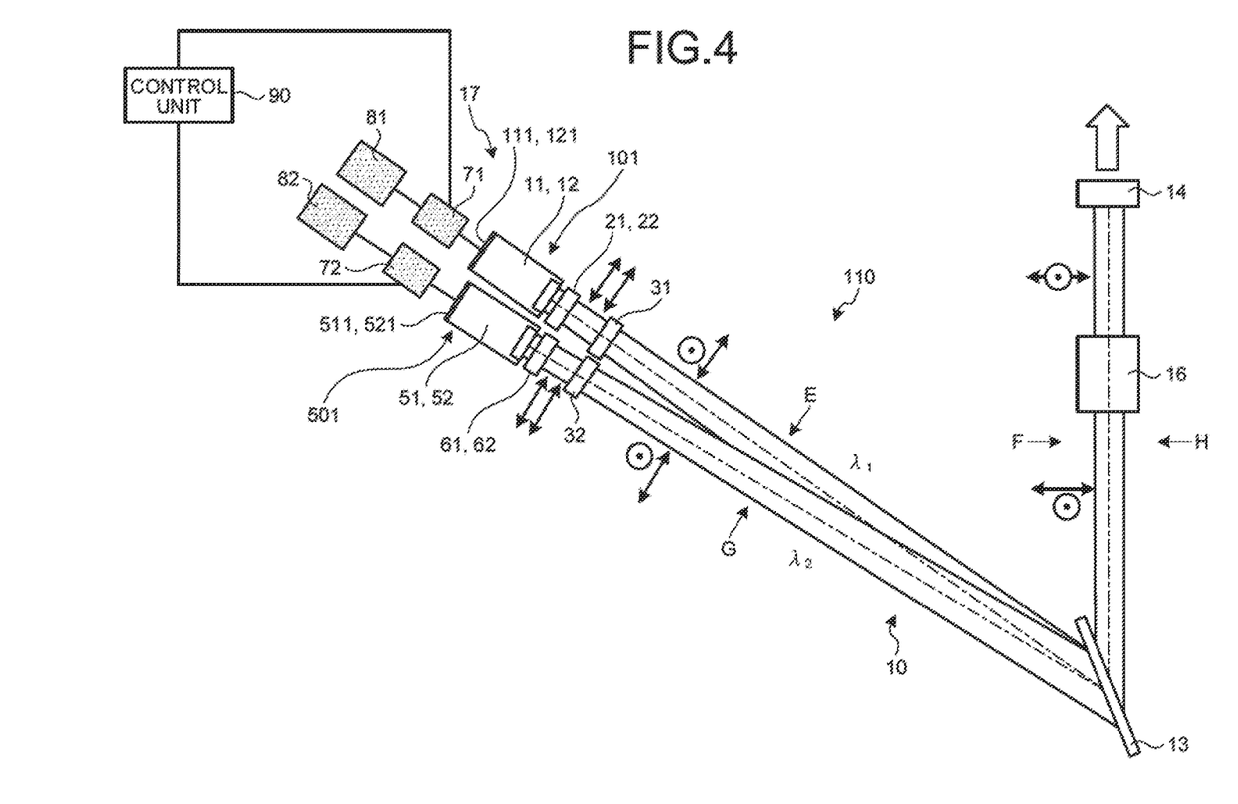
FIG. 4 is a schematic diagram illustrating a configuration of a laser oscillation apparatus according to a second embodiment of the present invention.
Figure 5:
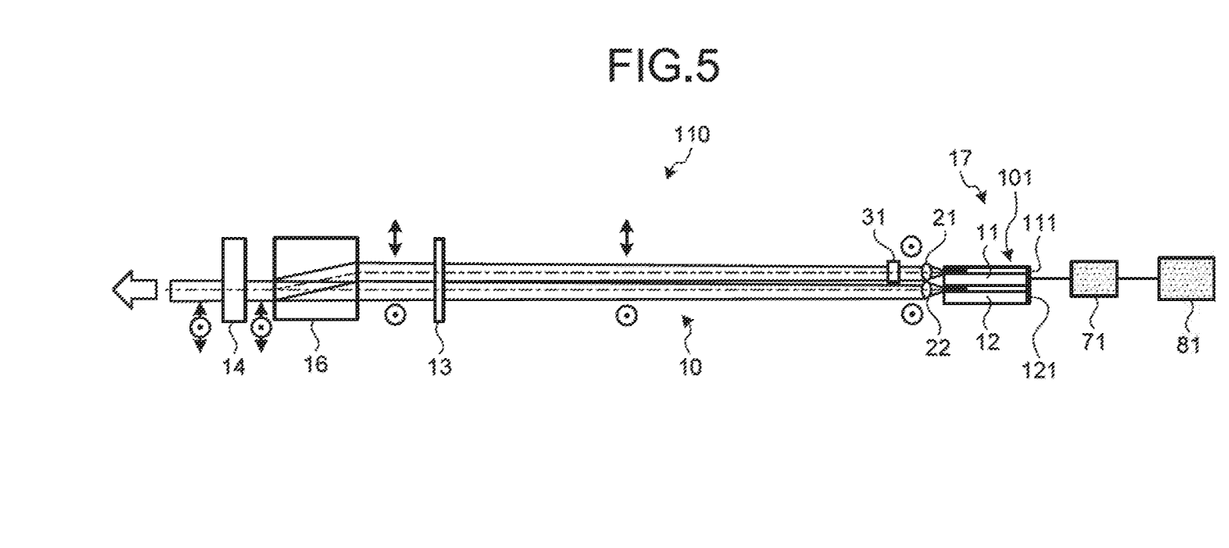
FIG. 5 is a schematic diagram illustrating the configuration of the laser oscillation apparatus according to the second embodiment.
Figure 6:
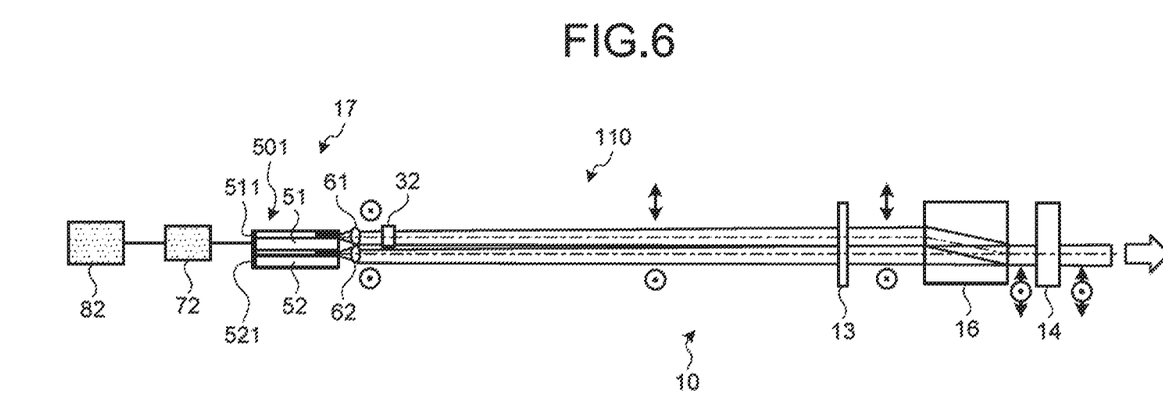
FIG. 6 is a schematic diagram illustrating the configuration of the laser oscillation apparatus according to the second embodiment.

FIGS. 4, 5, and 6 are schematic diagrams illustrating a configuration of a laser oscillation apparatus according to a second embodiment of the present invention. FIG. 4 illustrates a configuration of a laser oscillation apparatus 110 in the dispersion combining dimension. FIGS. 5 and 6 schematically illustrate the configurations of the laser oscillation apparatus 110 in the polarization combining direction and in a plane including the optical axis of a laser beam. FIG. 5 illustrates, in combination, a portion that extends from the diffraction grating 13 toward the semiconductor lasers 11 and 12 viewed from the direction of the arrow E in FIG. 4 and a portion that extends from the diffraction grating 13 toward the partial reflection mirror 14 viewed from the direction of the arrow F in FIG. 4. FIG. 6 illustrates, in combination, a portion that extends from the diffraction grating 13 toward the semiconductor lasers 51 and 52 viewed from the direction of the arrow G in FIG. 4 and a portion that extends from the diffraction grating 13 toward the partial reflection mirror 14 viewed from the direction of the arrow H in FIG. 4. The laser oscillation apparatus 110 according to the second embodiment is different from the first embodiment in that the birefringent element 16, which is the polarization combining element, is disposed inside the external resonator 10. That is, in the laser oscillation apparatus 110 according to the second embodiment, the birefringent element 16 is disposed between the diffraction grating 13 and the partial reflection mirror 14. Thus, the laser beams diffracted by the diffraction grating 13, which is the wavelength dispersive element, are incident on the birefringent element 16 and are polarization-combined, and then the polarization-combined laser beams are incident on the partial reflection mirror 14, which is the partial reflective element.

As described in the first embodiment, there are various types of birefringent elements, but it is difficult in some cases to manufacture high quality and large elements. For this reason, in order to obtain a less-expensive and stable laser oscillation apparatus, it is desirable that the beam diameter on the birefringent element is small. As described in the first embodiment, since a laser beam from a semiconductor laser diverges because of diffraction after the laser beam is collimated by the collimator lens, the beam diameter tends to be larger as the beam is farther away from the collimator lens. Although installation of a plurality of lenses or a single lens inside and outside the external resonator enables adjustment of the beam diameter, this may make the apparatus complicated and may make it impossible to resonate the laser beam.

In the laser oscillation apparatus 110 according to the second embodiment, the birefringent element 16 is disposed between the diffraction grating 13 and the partial reflection mirror 14 of the external resonator 10; therefore, the beam diameter on the birefringent element 16 can be smaller than the beam diameter in the case with the laser oscillation apparatus 100 according to the first embodiment, in which the birefringent element 16 is disposed outside the external resonator 10. Thus, it is possible to obtain the less-expensive and high-stable laser oscillation apparatus 110.

In each embodiment described above, four semiconductor lasers in total; two in the polarization combining direction and two in the dispersion combining dimension, are used in order simplify the explanation. However, three or more semiconductor lasers can be installed in the dispersion combining dimension. By installing three or more semiconductor lasers in the dispersion combining dimension, it is possible to achieve higher output and higher brightness than the configuration having two semiconductor lasers.

In the above embodiment, wavelength combining is performed by a diffraction grating, which is a transmission type wavelength dispersive element, but wavelength combining can also be performed using a reflection type wavelength dispersive element.

Third Embodiment

Figure 7:
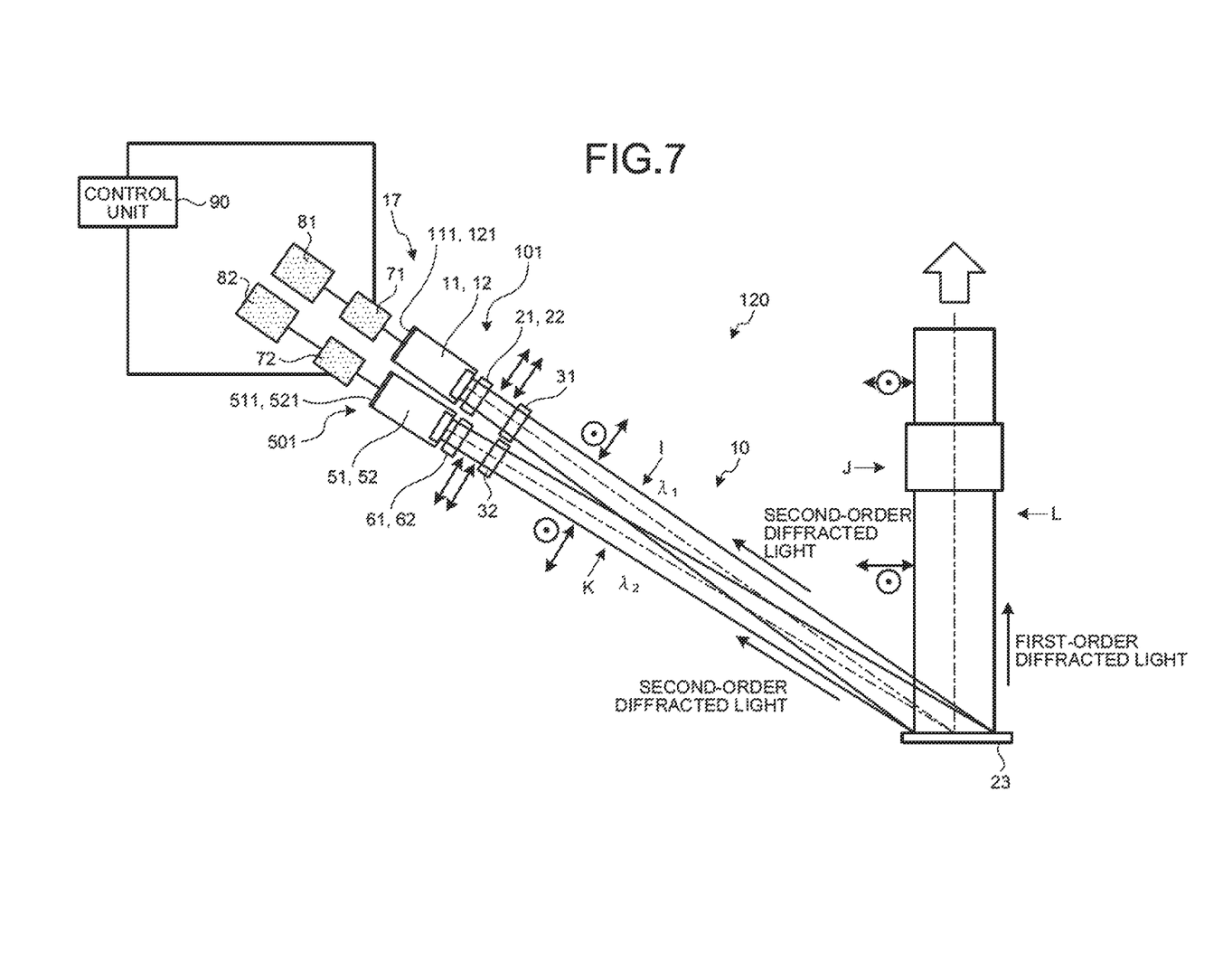
FIG. 7 is a schematic diagram illustrating a configuration of a laser oscillation apparatus according to a third embodiment of the present invention.
Figure 8:
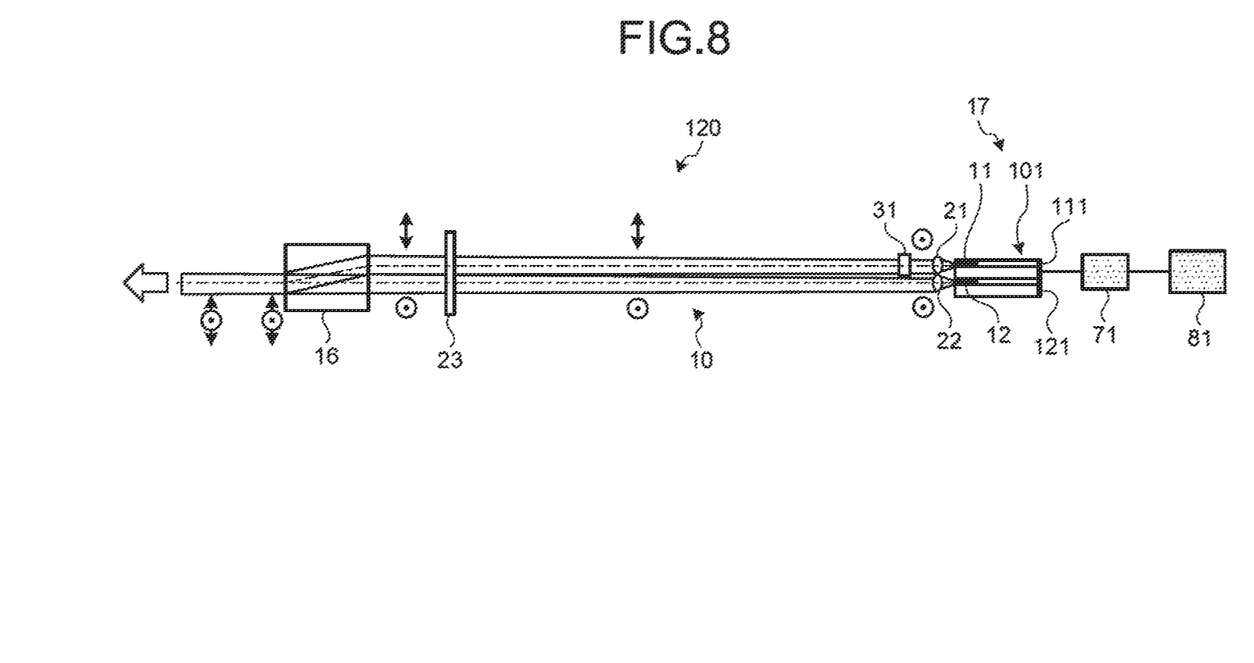
FIG. 8 is a schematic diagram illustrating the configuration of the laser oscillation apparatus according to the third embodiment.
Figure 9:
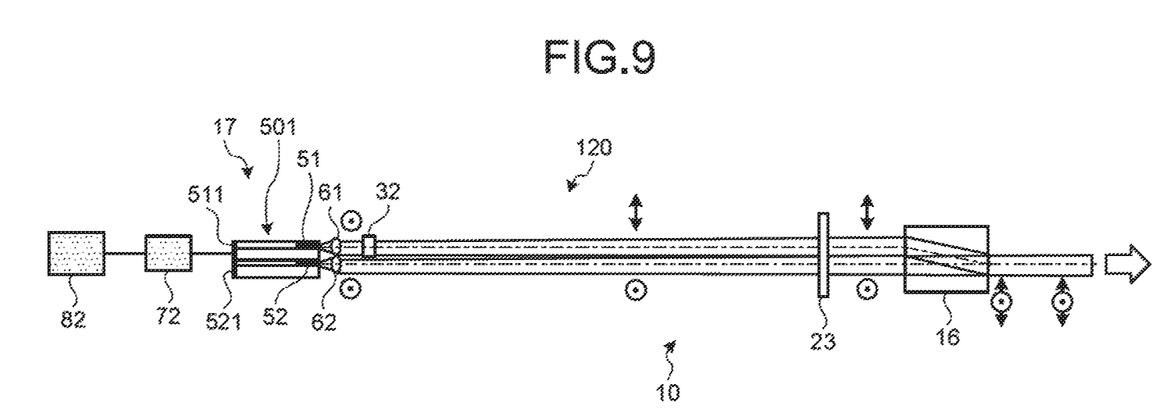
FIG. 9 is a schematic diagram illustrating the configuration of the laser oscillation apparatus according to the third embodiment.

FIGS. 7, 8 and 9 are schematic diagrams illustrating a configuration of a laser oscillation apparatus according to a third embodiment of the present invention. FIG. 7 illustrates a configuration of a laser oscillation apparatus 120 in the dispersion combining dimension. FIGS. 8 and 9 schematically illustrate configurations of the laser oscillation apparatus 120 in the polarization combining direction and in a plane including the optical axis of a laser beam. FIG. 8 illustrates, in combination, a portion that extends from a diffraction grating 23 toward the semiconductor lasers 11 and 12 viewed from the direction of the arrow I in FIG. 7 and a portion that extends from the diffraction grating 23 toward the birefringent element 16 viewed from the direction of the arrow J in FIG. 7. FIG. 9 illustrates, in combination, a portion that extends from the diffraction grating 23 toward the semiconductor lasers 51 and 52 viewed from the direction of the arrow K in FIG. 7 and a portion that extends from the diffraction grating 23 toward the birefringent element 16 viewed from the direction of the arrow L in FIG. 7. The configuration of the external resonator 10 of the laser oscillation apparatus 120 according to the third embodiment is different from those in the first and second embodiments.

In the first and second embodiments, the partial reflection mirror 14 is disposed for the first-order diffracted light of the semiconductor laser beam at the diffraction grating 13. In the third embodiment, the second-order diffracted light of the laser beam at the diffraction grating 23 is returned to the semiconductor lasers 11, 12, 51, and 52. That is, in the laser oscillation apparatus 120 according to the third embodiment, the semiconductor lasers 11, 12, 51, and 52 and the diffraction grating 23 constitute the external resonator 10. At this time, the first-order diffracted light is diffracted at zero diffraction angle. That is, the first-order diffracted light is emitted perpendicularly to the diffraction grating 23. The first-order diffracted light is used for an output beam of the laser oscillation apparatus 120. The laser oscillation apparatus 120 includes the multiple semiconductor lasers 11, 12, 51, and 52, but can superpose laser beams from the multiple semiconductor lasers 11, 12, 51, and 52 into one beam since the first-order diffracted light is emitted perpendicularly to the diffraction grating 23.

In the laser oscillation apparatus 102 according to the third embodiment, by inserting the birefringent element 16 in the optical path of the first-order diffracted light to the diffraction grating 23, it is possible to obtain a high laser output.

Since no partial reflection mirror is used in the laser oscillation apparatus 120 according to the third embodiment, it is possible to simplify and downsize the apparatus, to reduce the loss inside the external resonator 10, and to improve the efficiency of laser oscillation.

The configurations described in the above embodiments are merely examples of an aspect of the present invention and can be combined with other known techniques, and part of the configurations can be omitted or changed without departing from the gist of the present invention.

REFERENCE SIGNS LIST 10 external resonator; 11, 12, 51, 52 semiconductor laser; 13, 23 diffraction grating; 14 partial reflection mirror; 16 birefringent element; 17 laser beam source; 21, 22, 61, 62 collimator lens; 31, 32 wave plate; 71, 72 drive circuit; 81, 82 driving power supply; 90 control unit; 100, 110, 120 laser oscillation apparatus; 101, 501 laser unit; 111, 112, 511, 521 reflective coating.

The invention claimed is:

1. A laser oscillation apparatus comprising:
a laser beam source comprising a plurality of laser units each including two semiconductor lasers disposed in a fast axis direction of the semiconductor lasers to emit laser beams having a same oscillation wavelength and polarized in a first direction, the laser units having oscillation wavelengths different from each other and being disposed in a slow axis direction of the semiconductor lasers; and
a partial reflective element to reflect and return part of the laser beams toward the laser beam source and to transmit a remainder, wherein
a polarization-direction changing element, a wavelength dispersive element, and a polarization combining element are disposed between the laser beam source and the partial reflective element,
the polarization-direction changing element changes a polarization direction of a laser beam emitted from one of the two semiconductor lasers of the laser unit to a second direction orthogonal to the first direction,
the wavelength dispersive element is disposed at a position where the laser beams polarized in the first direction are superposed into one beam and the laser beams whose polarization directions are changed to the second direction are superposed into one beam, superposes the laser beams polarized in the first direction so as to have one optical axis, superposes the laser beams polarized in the second direction so as to have one optical axis, and outputs the superposed laser beams toward the partial reflective element, and
the polarization combining element combines two laser beams into a laser beam having one optical axis, the two laser beams having optical axes different from each other and being output from the wavelength dispersive element.

2. The laser oscillation apparatus according to claim 1, wherein the polarization combining element is disposed between the wavelength dispersive element and the partial reflective element.

3. The laser oscillation apparatus according to claim 1, wherein the two semiconductor lasers of the laser unit are in contact with each other without any gap therebetween.

4. The laser oscillation apparatus according to claim 1, wherein the polarization combining element is a birefringent element.

5. A laser oscillation apparatus comprising:
a laser beam source comprising a plurality of laser units each including two semiconductor lasers disposed in a fast axis direction of the semiconductor lasers to emit laser beams having a same oscillation wavelength and polarized in a first direction, the laser units having oscillation wavelengths different from each other and being disposed in a slow axis direction of the semiconductor lasers;
a polarization-direction changing element to change a polarization direction of a laser beam emitted from one of the two semiconductor lasers of the laser unit to a second direction orthogonal to the first direction;
a wavelength dispersive element disposed at a position where the laser beams polarized in the first direction are superposed into one beam and the laser beams whose polarization directions are changed to the second direction are superposed into one beam, the wavelength dispersive element returning part of the laser beams toward the laser beam source as a second-order diffracted light, superposing the laser beams polarized in the first direction as a first-order diffracted light so as to have one optical axis and superposing the laser beams polarized in the second direction as a first-order diffracted light so as to have one optical axis, and emitting the superposed laser beams; and a polarization combining element to combine two laser beams into a laser beam having one optical axis, the two laser beams having optical axes different from each other and being output from the wavelength dispersive element.

6. The laser oscillation apparatus according to claim 2, wherein the two semiconductor lasers of the laser unit are in contact with each other without any gap therebetween.

7. The laser oscillation apparatus according to claim 2, wherein the polarization combining element is a birefringent element.

\* \* \* \* \*